(12) United States Patent
Pinter

(10) Patent No.: US 6,429,085 B1
(45) Date of Patent: Aug. 6, 2002

(54) SELF-ALIGNED NON-SELECTIVE THIN-EPI-BASE SILICON GERMANIUN (SIGE) HETEROJUNCTION BIPOLAR TRANSISTOR BICMOS PROCESS USING SILICON DIOXIDE ETCHBACK

(75) Inventor: Jerald Frank Pinter, Carlsbad, CA (US)

(73) Assignee: Applied Micro Circuits Corporation, San Diego, CA (US)

(*) Notice: Subject to any disclaimer, the term of this patent is extended or adjusted under 35 U.S.C. 154(b) by 0 days.

(21) Appl. No.: 09/656,117

(22) Filed: Sep. 6, 2000

Related U.S. Application Data

(63) Continuation of application No. 09/340,344, filed on Jun. 25, 1999, now Pat. No. 6,169,007.

(51) Int. Cl.[7] .............................................. H01L 21/331
(52) U.S. Cl. ...................... 438/320; 438/314; 438/348; 438/364
(58) Field of Search ................................. 438/320, 314, 438/348, 364; 257/192

(56) References Cited

U.S. PATENT DOCUMENTS

| | | | |
|---|---|---|---|
| 5,024,957 A | * | 6/1991 | Harame et al. |
| 5,108,946 A | | 4/1992 | Zdebel et al. |
| 5,206,182 A | | 4/1993 | Freeman |
| 5,286,518 A | | 2/1994 | Cain et al. |
| 5,290,716 A | * | 3/1994 | Nakmura |
| 5,424,227 A | | 6/1995 | Dietrich et al. |
| 5,484,737 A | | 1/1996 | Ryun et al. |
| 5,494,836 A | | 2/1996 | Imai |
| 5,504,039 A | | 4/1996 | Grivna |
| 5,633,179 A | | 5/1997 | Kamins et al. |
| 5,663,097 A | | 9/1997 | Sakamoto et al. |
| 5,702,980 A | | 12/1997 | Yu et al. |
| 5,759,880 A | | 6/1998 | Shiralagi et al. |
| 5,773,350 A | * | 6/1998 | Herbert et al. ............... 438/364 |
| 5,792,702 A | | 8/1998 | Liang |
| 5,821,163 A | | 10/1998 | Harvey et al. |
| 5,846,858 A | | 12/1998 | Kerber |
| 5,846,867 A | | 12/1998 | Gomi et al. |
| 5,897,359 A | * | 4/1999 | Cho et al. .................... 438/312 |
| 6,169,007 B1 | * | 1/2001 | Pinter ......................... 438/320 |

OTHER PUBLICATIONS

"Epitaxial–Baes Double–Poly Self–Aligned Bipolar Transistors", Ganin et al, IEDM 90–603, 1990.
Si/SiGe Epitaxial–Base Transistors–Part I: Materials, Physics and Circuits, Harame et al, IEEE 1995.

* cited by examiner

*Primary Examiner*—Long Pham
(74) *Attorney, Agent, or Firm*—Gray Cary Ware & Freidenrich

(57) ABSTRACT

A process used in the fabrication of a self-aligned non-selective thin-epi-base silicon germanium (SiGe) heterojunction bipolar transistor (HBT) BiCMOS. The process involves using TEOS or Spin-On-Glass (SOG) silicon dioxide etchback in the fabrication of the SiGe BiCMOS device.

17 Claims, 5 Drawing Sheets

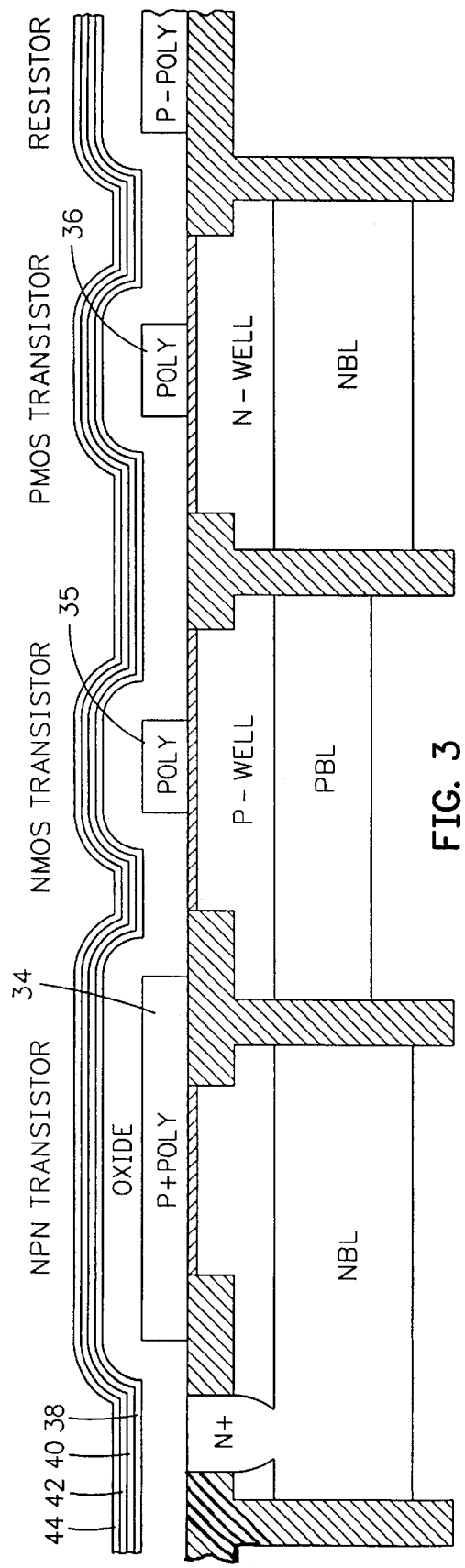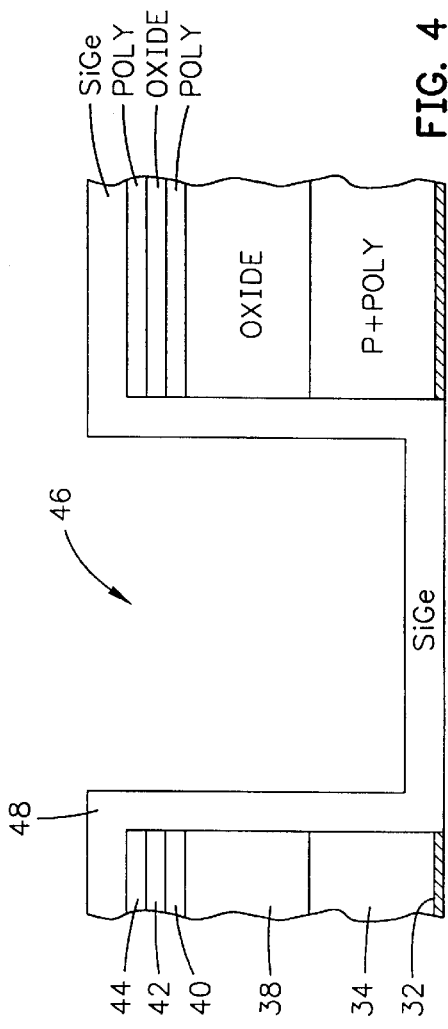

SELF-ALIGNED NON-SELECTIVE THIN-EPI-BASE SILICON GERMANIUN (SIGE) HETEROJUNCTION BIPOLAR TRANSISTOR BICMOS PROCESS USING SILICON DIOXIDE ETCHBACK

This application is a continuation of U.S. patent application Ser. No. 09/340,344, filed Jun. 25, 1999, now U.S. Pat. No. 6,169,007.

BACKGROUND OF THE INVENTION

The present invention relates to a BICMOS process used in fabricating a self-aligned non-selective thin-epi-base silicon germanium (SiGe), heterojunction bipolar transistor (HBT), and particularly to a SiGe HBT BiCMOS process using silicon dioxide etchback.

FIELD OF THE INVENTION

The first fabrication process used for making commercial chips was the bipolar process, called so because it was used for making bipolar transistors, however, it was limited in size and power. Next, the chips were made using MOS technology with either pMOS or nMOS. At about the same time the CMOS (complementary MOS) process was developed in which pMOS and nMOS devices coexisted on the same chip. More recently, with a few extra fabrication steps, processes were developed to make both CMOS devices and optimized bipolar transistors. These are called BiCMOS (bipolar CMOS) processes. Such processes add flexibility to circuit design at a increased fabrication cost. The last few years have seen rapid progress in techniques for the deposition of both epitaxial layers of silicon as well as pseudomorphic SiGe epitaxial layers for the bipolar transistor. The SiGe material set can provide a path to heterojunction device physics and applications within the well established (CMOS dominated) silicon-based semiconductor industry.

In recent years, a photoresist etchback process has been proposed to fabricate SiGe HBT's. There is a general need for alternate fabrication processes to manufacture SiGe HBT's. More specifically, a need exists for processes, other than photoresist etchback processes, for removing the unwanted SiGe film in the field areas around the heterojunction bipolar transistors.

SUMMARY OF THE INVENTION

The invention describes a process of making self-aligned Heterojunction Bipolar Transistors (HBT). The HBT is made with Silicon Germanium (SiGe), becoming known as a SiGe HBT. The present invention describes a process of making the SiGe HBT which does not use photoresist etchback. Instead, in one embodiment of the present invention, a TEOS silicon dioxide etchback is used. In another embodiment, a Spin-On-Glass (SOG) silicon dioxide etchback is used.

A typical BiCMOS process includes a silicon bipolar transistor, a NMOS transistor and a PMOS transistor. In this case the bipolar transistor shown is a SiGe Heterojunction Bipolar Transistor (HBT). The BiCMOS base has the three devices fabricated on a P-Substrate. Each of the devices in the BiCMOS base are separated by Deep Trench Isolation, with each deep trench topped with a field oxide layer and a gate oxide layer covering the rest of the BiCMOS base.

On top of the BiCMOS base, a plurality of polysilicon features are deposited. Multiple layers are next deposited over the structure. The multiple layers include silicon dioxide, a thin protection layer of polysilicon, another protection layer of silicon dioxide and a seed layer of polysilicon. A well is formed in the multiple layers by masking and etching the gate oxide, polysilicon layer, the silicon dioxide layer, the polysilicon protection layer, the silicon dioxide protection layer and the polysilicon seed layer. After etching, a non-selective thin epi base of silicon germanium (SiGe) is deposited.

In a first embodiment, a thick layer of TEOS plasma silicon dioxide is non-selectively deposited on the SiGe, filling the well. Optionally, to. fill in the cracks and smooth out the upper surface of the TEOS plasma silicon dioxide, a layer of Spin-on-Glass (SOG) silicon dioxide may be deposited on the TEOS plasma silicon dioxide layer and cured. In an alternate embodiment, the TEOS plasma silicon dioxide layer may omitted and SOG silicon dioxide is used to fill the well.

The TEOS plasma silicon dioxide and/or the SOG silicon dioxide layer is etched until the remaining portion fills approximately one half the well. Next, an anisotropic polysilicon etch is done removing the SiGe layer outside the well area (i.e., from the "field area") and also the top portion of the SiGe layer on the upper walls of the well. Also etched during this process is the polysilicon seed layer. A thin silicon nitride layer is non-selectively deposited on the TEOS plasma silicon dioxide layer and the silicon dioxide protection layer. This silicon nitride is then etched back to cover only the upper walls of the well. A Buffered Oxide Etch (BOE) is done to remove the TEOS plasma silicon dioxide layer and the silicon dioxide protection layer. The well is now lined with the SiGe base layer along the bottom and lower porion of the walls of the well with silicon nitride layers at the upper wall, contiguous with the SiGe layer.

Layers of silicone dioxide, silicon nitride, a spacer layer of polysilicon are non-selectively deposited on the surface. The polysilicon spacer layer and silicon nitride layer are then plasma etched back (anisotropic) until the only portion remaining of the layers fill the lower corners of the well. A silicon dioxide dip etch is next, which completely removes the polysilicon spacer layer and silicon dioxide protection layer. An emitter polysilicon deposition with a N+ implant is deposited next and is masked and etched to create the SiGe heterojunction bipolar transistor.

Other objects and advantages of the present invention will become apparent upon reading the following description taken together with the accompanying drawings.

BRIEF DESCRIPTION OF THE DRAWING

FIG. 3 is a sectional view of the BiCMOS base of FIG. 2 with multiple layers deposited on the upper surface;

FIG. 4 show a well etched into the multiple layers on the top surface of the BiCMOS base shown in FIG. 3 with silicon germanium (SiGe) non-selectively deposited in the well and top surface;

DETAILED DESCRIPTION OF THE PREFERRED EMBODIMENTS

Figure 1:
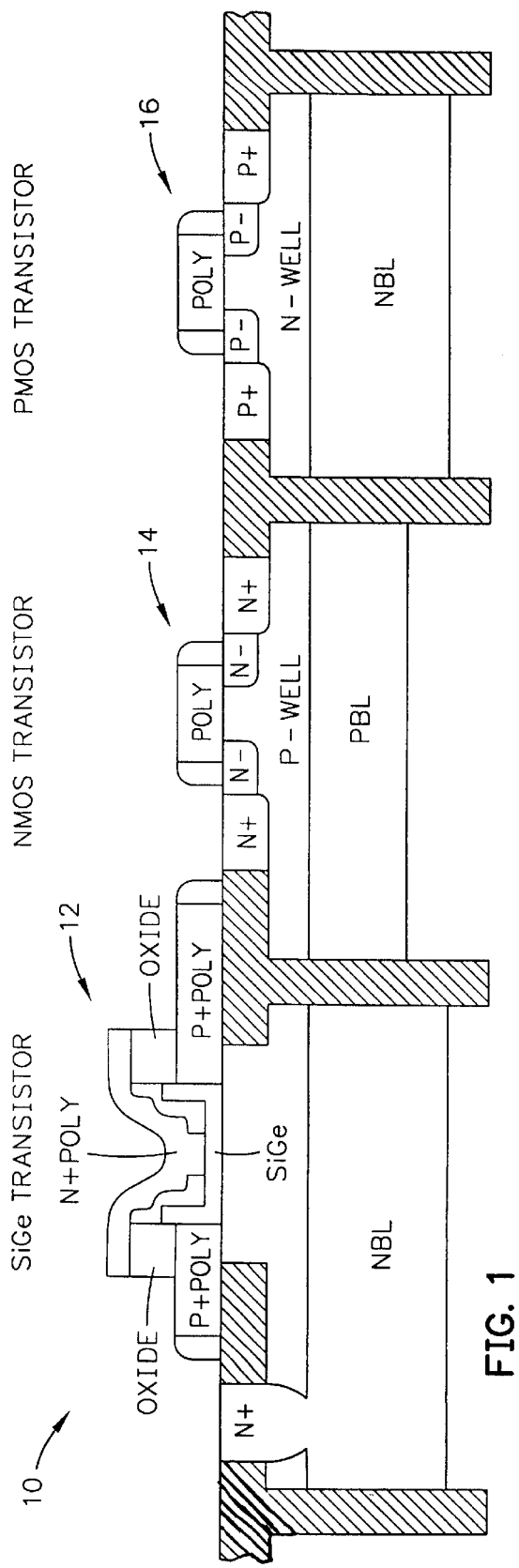
FIG. 1 is a sectional view of the complete BICMOS process (excluding metal layers)

Referring now to the drawings and figures in which identical reference numerals refer to identical elements, FIG. 1 shows a BiCMOS process sectional view 10 which includes a silicon germanium bipolar transistor 12, a NMOS transistor 14 and a PMOS transistor 16. The bipolar transistor 12 shown is a SiGe Heterojunction Bipolar Transistor (HBT). The present invention discloses a process of fabricating the SiGe HBT 12. The process includes making a self-aligned non-selective thin-epi-base SiGe HBT 12 using TEOS or Spin-On-Glass (SOG) silicon dioxide etchback.

Figure 2:
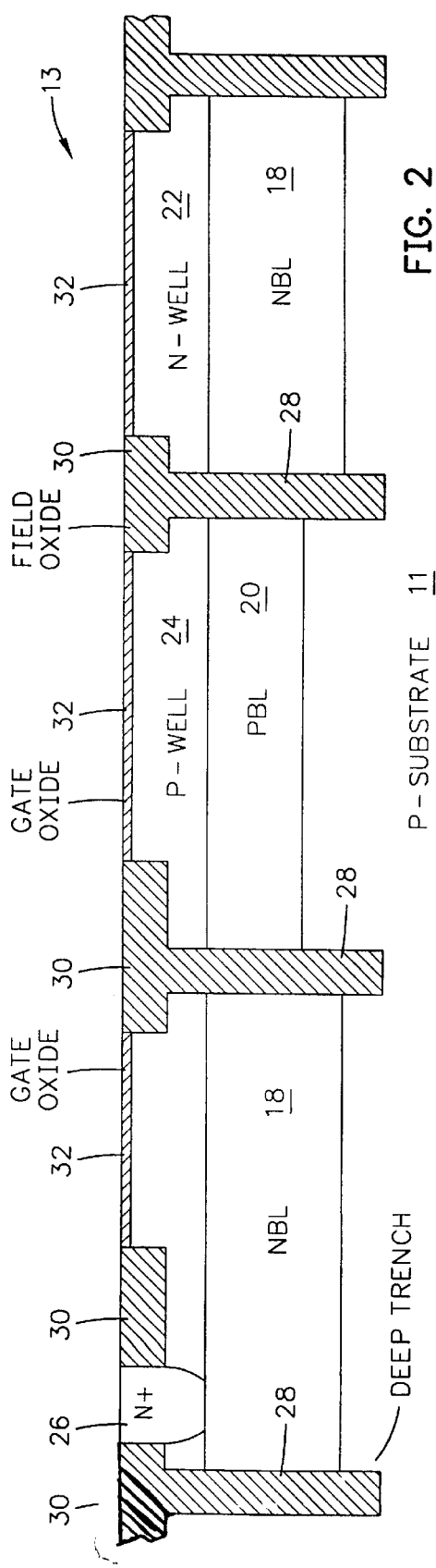
FIG. 2 is a sectional view of the BICMOS process after well formation and isolation.

FIG. 2 shows a BiCMOS base 13 with three devices fabricated on a P-Substrate 11. Also shown are two N-Buried Layers (NBL) 18 and a P-Buried Layer (PBL) 20 formed on top of the P-substrate 11. A N-Well 22 is formed on top of the NBL 18 in the PMOS transistor area, a P-Well 24 is formed on top of the PBL 20 in the NMOS transistor area and a N+ Collector Plug 26 is formed on the NBL 18 in the SiGe HBT area. Each of the separate areas in the BiCMOS base are separated by Deep Trench Isolation 28. Each of the legs of the deep trench 28 are topped with a field oxide layer 30. A gate oxide layer 32 covers the rest of the BiCMOS base. The fabrication techniques of the BiCMOS base 10 are known in the industry and will not be disclosed in the present application.

FIG. 3 shows the next step in the fabrication of the BiCMOS device by forming a plurality of polysilicon features 34, 35 and 36 on the gate oxide 32 and field oxide 30. This is done with polysilicon deposited, masked and etched on the base 10 using standard processing techniques. A layer of silicon dioxide 38, approximately 3000–5000 Å, is deposited covering the polysilicon, gate oxide and field oxide. A thin protection layer of polysilicon 40, approximately 500 Å, is deposited on the silicon dioxide layer 38. A protection layer of silicon dioxide 42, approximately 500 Å, is deposited on the polysilicon 40. A seed layer of polysilicon 44, approximately 500 Å, is deposited on the silicon dioxide layer 42. The polysilicon seed layer 44 is used to provide a silicon (Si) surface for subsequent deposition of silicon germanium (SiGe).

FIG. 4 illustrates the beginning steps for the formation of the heterojunction bipolar transistor. A well 46 is formed by masking and etching the gate oxide 32, polysilicon layer 34, the silicon dioxide layer 38, the polysilicon protection layer 40, the silicon dioxide protection layer 42 and the polysilicon seed layer 44. The side walls are illustrated as substantially perpendicular but may also be other shapes such as angled or curved. The processes for etching all of these layers may comprise one or more steps and are known in the art. After etching, a non-selective thin epi base of silicon germanium (SiGe) 48 is deposited. The layer of SiGe 48 is approximately 500–1000 Å thick.

Figure 5:
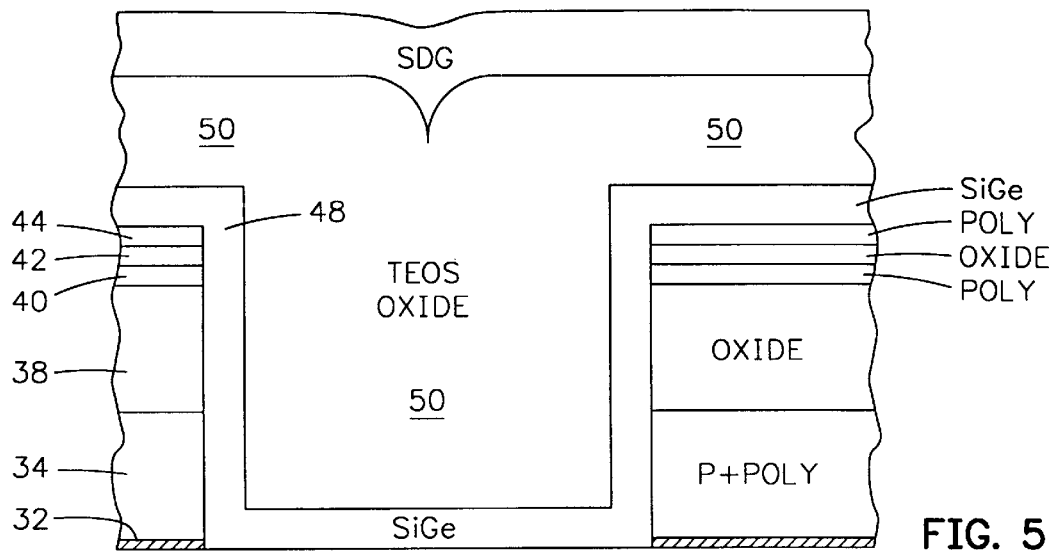
FIG. 5 shows TEOS silicon dioxide deposited in the SiGe lined well of the device in FIG. 4.

Referring now to FIG. 5, a thick layer of TEOS plasma silicon dioxide 50, approximately 10,000–15,000 Å, is deposited on the SiGe 48. The TEOS plasma silicon dioxide layer 50 fills in the well 46. To fill in the cracks and smooth out the upper surface, a layer of Spin-on-Glass (SOG) 52 is deposited on the TEOS plasma silicon dioxide layer 50 and cured. The thickness of the SOG layer is approximately 2000 Å. In an alternate embodiment, the TEOS plasma silicon dioxide layer 50 may omitted and only the SOG 52 is used to fill the well.

Figure 6:
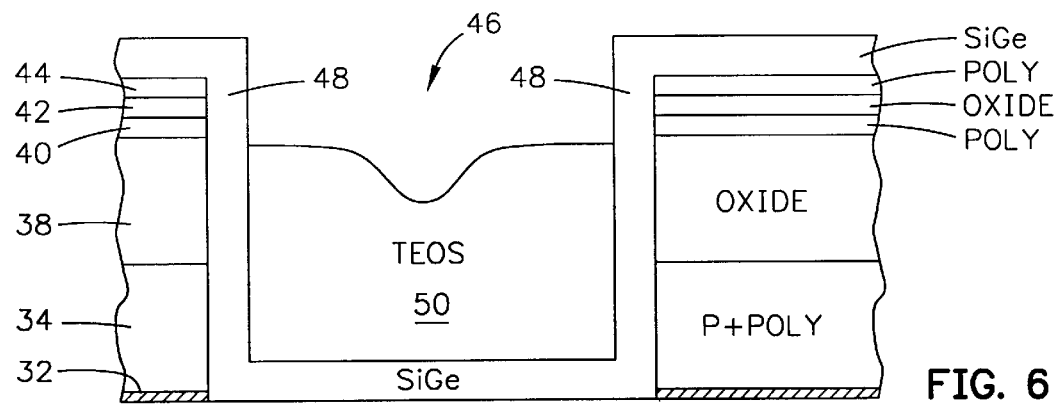
FIG. 6 shows the result of the TEOS silicon dioxide etchback where the remaining TEOS silicon dioxide covers the lower portion of the well.
Figure 7:
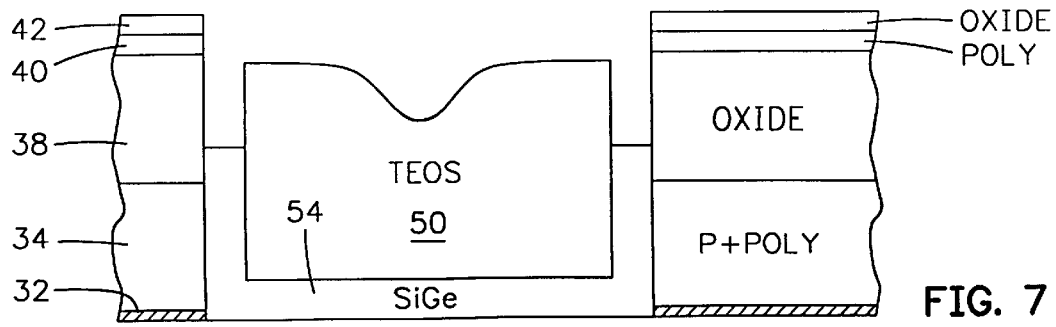
FIG. 7 shows the result of the anisotropic polysilicon etch of the device in FIG. 5.
Figure 8:
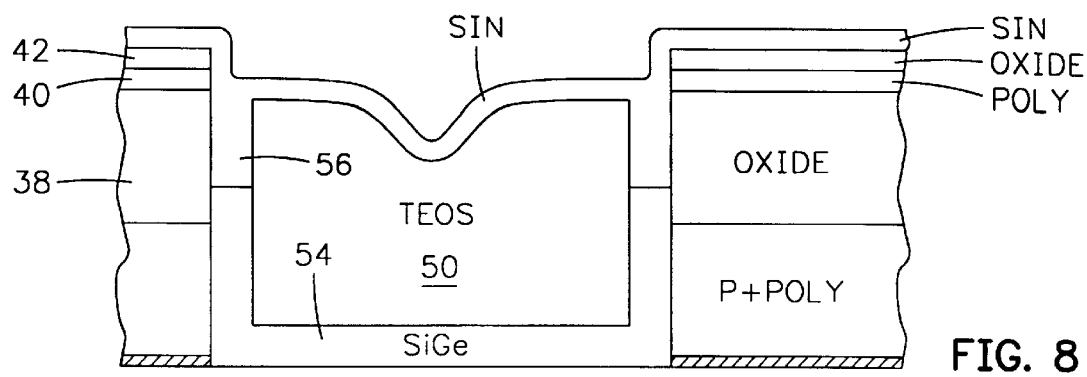
FIG. 8 shows the deposition of silicon nitride on the device in FIG. 7
Figure 9:
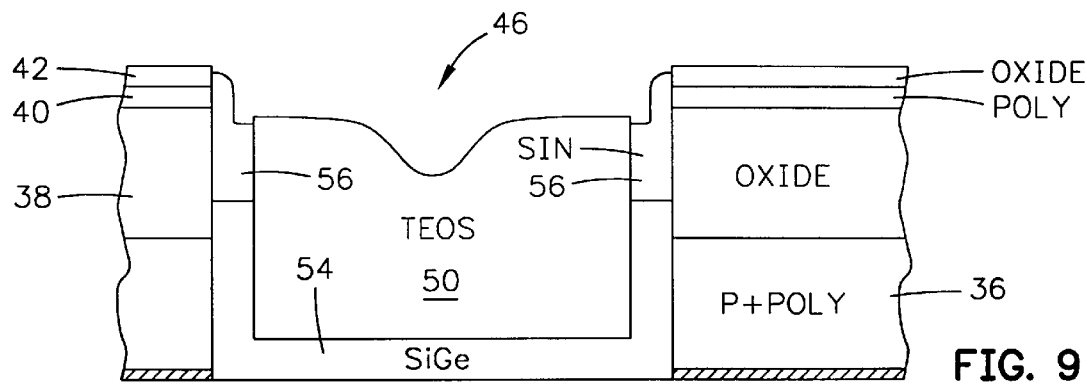
FIG. 9 shows the result of a silicon nitride etchback on the device in FIG. 8.
Figure 10:
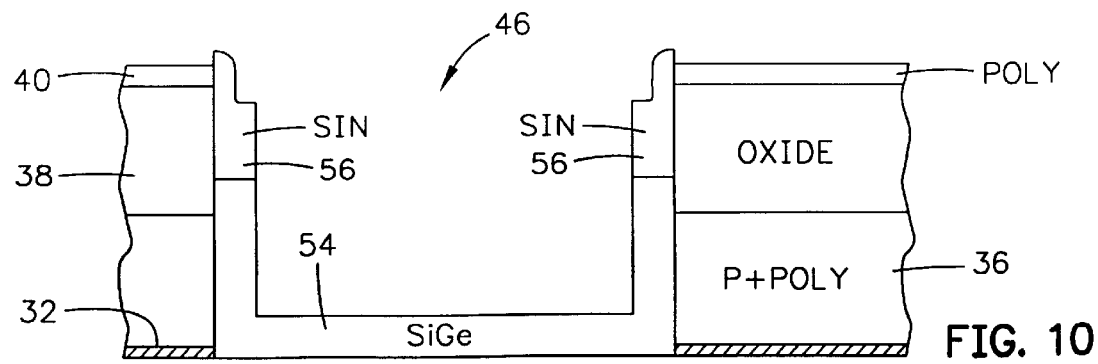
FIG. 10 shows the result of a silicon dioxide dip etch of the device shown in FIG. 9.

Referring now to FIGS. 6–10, the SOG layer 52 is completely etched away and the TEOS plasma silicon dioxide 50 layer is etched back until the remaining portion fills approximately one half the well 46 (see FIG. 6). Next, an anisotropic polysilicon etch is done, shown in FIG. 7, removing the the SiGe layer 48 outside the well area (i.e., from the "field area") and also the top portion of the SiGe layer 48 on the walls of the well 46. What is left is a SiGe base layer 54. Also etched during this process is the polysilicon seed layer 44, which is completely removed. A thin silicon nitride layer 56, approximately 300 Å, is non-selectively deposited on the TEOS plasma silicon dioxide layer 50 and the silicon dioxide protection layer 42. The silicon nitride layer 56 is used to protect the silicon dioxide layer 38 during etching. This silicon nitride 56 is then etched back to cover the upper wall of the well 46, as shown in FIG. 9. A Buffered Oxide Etch (BOE) is done to remove the TEOS plasma silicon dioxide layer 50 and the silicon dioxide protection layer 42. As shown in FIG. 10, the well 46 is now lined with the SiGe base layer 54 along the lower part of the well with silicon nitride layers 56 at the upper wall, contiguous the SiGe layer 54.

Figure 11:
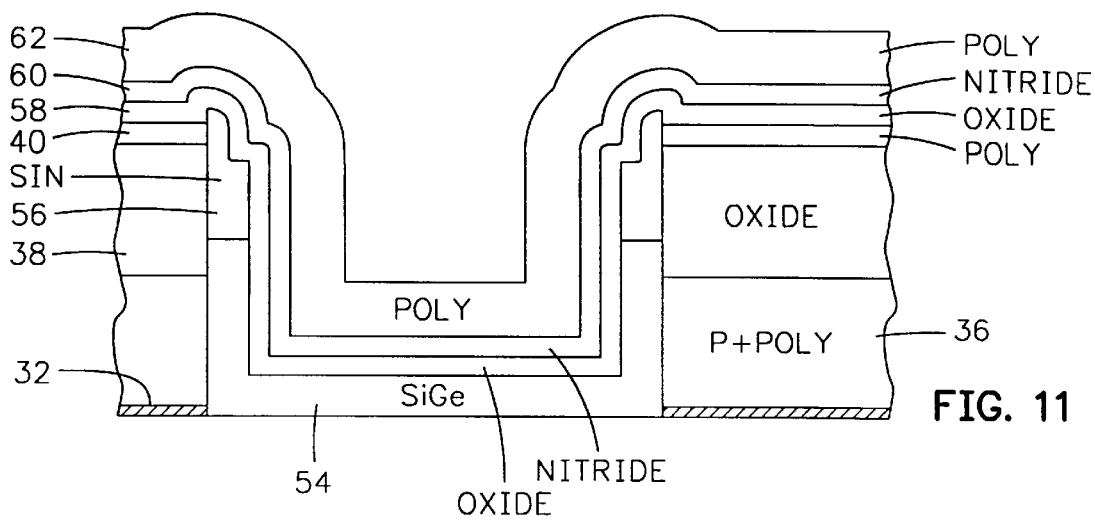
FIG. 11 shows the deposition of more multiple layers on the surface of the device shown in FIG. 10.
Figure 12:
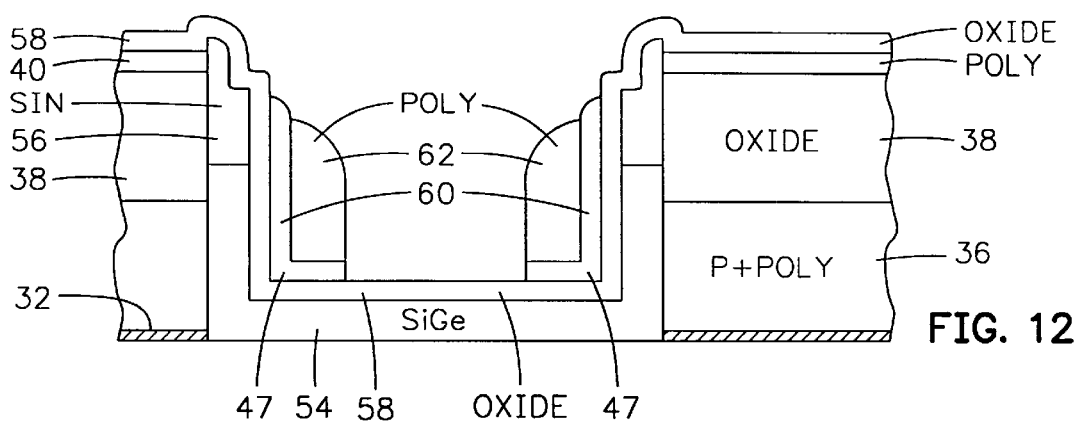
FIG. 12 shows the result of the polysilicon plasma etchback of the device in FIG. 11.
Figure 13:
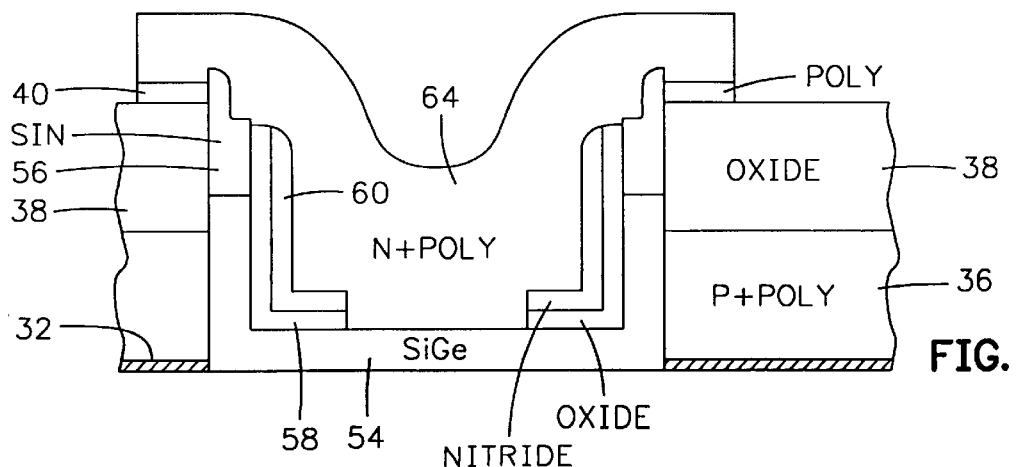
FIG. 13 shows the emitter and base regions of the completed SiGe heterojunction bipolar transistor on the BiCMOS base.

Referring to FIG. 11, the top surface is non-selectively covered with a deposition of a thin layer of silicon dioxide 58, approximately 500 Å thick. A layer of silicon nitride 60 is deposited on the silicon dioxide layer 58, the silicon nitride layer 60 being approximately 300 Å thick. Finally, a spacer layer of polysilicon 62, approximately 4000–8000 Å, is deposited on the silicon dioxide layer 60. The polysilicon spacer layer 62 and silicon nitride layer 60 are then plasma etched back (anisotropic) until the only portion of the layers remaining fill the lower corners 47 of the well 46. The result is shown in FIG. 12. A silicon dioxide dip etch is next, which removes silicon dioxide protection layer 58. An emitter polysilicon deposition 64, approximately 2000–4000 Å with a N+ implant, is deposited next and is masked and etched to create the SiGe heterojunction bipolar transistor, shown in FIG. 13.

While only certain preferred features of this invention have been shown by way of illustration, many changes and modifications will occur to those skilled in the art. Accordingly, it is to be understood that the appended claims are intended to cover all such modifications and changes as fall within the true spirit and scope of the invention.

I claim:

1. A method of fabricating a bipolar transistor, comprising:
   depositing silicon germanium in and outside a well;
   forming TEOS silicon dioxide such that at least a portion of the silicon germanium in the well is positioned under TEOS silicon dioxide and at least a portion of silicon germanium outside the well is not positioned under TEOS silicon dioxide; and
   removing at least a portion of the silicon germanium that is not positioned under TEOS silicon dioxide.

2. The method of claim 1, wherein removing at least a portion of the silicon germanium that is not positioned under TEOS silicon dioxide includes
removing the silicon germanium located outside the well.

3. The method of claim 1, wherein removing at least a portion of the silicon germanium that is not positioned under TEOS silicon dioxide includes
removing at least a portion of silicon germanium positioned between the TEOS silicon dioxide and a wall of the well.

4. The method of claim 1, wherein removing at least a portion of the silicon germanium that is not positioned under TEOS silicon dioxide includes performing an anisotropic etch.

5. The method of claim 1, wherein removing at least a portion of the silicon germanium that is not positioned under TEOS silicon dioxide is performed so as to leave silicon germanium adjacent to a bottom of the well and adjacent to at least a portion of a wall of the well.

6. The method of claim 1, wherein forming TEOS silicon dioxide such that at least a portion of the silicon germanium the well is positioned under TEOS silicon dioxide and at least a portion of silicon germanium outside the well is not positioned under TEOS silicon dioxide includes
forming the TEOS silicon dioxide such that a portion of the silicon germanium in the well is positioned under TEOS silicon dioxide and the silicon germanium outside the well is not positioned under TEOS silicon dioxide.

7. The method of claim 1, wherein forming TEOS silicon dioxide such that at least a portion of the silicon germanium in the well is positioned under TEOS silicon dioxide and at least a portion of silicon germanium outside the well is not positioned under TEOS silicon dioxide includes
forming the TEOS silicon dioxide over the deposited silicon dioxide;
forming spin-on-glass over the TEOS silicon dioxide; and
etching the TEOS silicon dioxide and the spin-on-glass.

8. The method of claim 1, wherein depositing silicon germanium in and outside a well includes depositing silicon germanium adjacent to a wall of the well.

9. The method of claim 8, wherein forming TEOS silicon dioxide such that at least a portion of the silicon germanium in the well is positioned under TEOS silicon dioxide and at least a portion of silicon germanium outside the well is not positioned under TEOS silicon dioxide includes
forming TEOS silicon dioxide such that silicon germanium adjacent to the wall of the well is not positioned under the TEOS silicon dioxide.

10. The method of claim 1, wherein removing at least a portion of the silicon germanium that is not positioned under TEOS silicon dioxide causes TEOS silicon dioxide positioned in the well to extend above silicon germanium in the well.

11. The method of claim 1, further comprising:
forming silicon nitride over a portion of the silicon germanium which is positioned adjacent to a wall of the well.

12. The method of claim 11, wherein the formed silicon nitride is adjacent to the wall of the well.

13. The method of claim 11, further comprising:
removing the TEOS silicon dioxide positioned in the well after forming the silicon nitride.

14. The method of claim 1, further comprising:
removing the TEOS silicon dioxide positioned in the well after removing at least a portion of the silicon germanium that is not positioned under TEOS silicon dioxide.

15. The method of claim 14, further comprising:
forming silicon dioxide in a corner of the well over a portion of the silicon germanium left in the well after removing the TEOS silicon dioxide positioned in the well.

16. The method of claim 14, further comprising:
forming silicon nitride in a corner of the well over a portion of the silicon germanium left in the well after removing the TEOS silicon dioxide positioned in the well.

17. The method of claim 14, further comprising:
forming polysilicon in a corner of the well over a portion of the silicon germanium left in the well after removing the TEOS silicon dioxide positioned in the well.

* * * * *